Nov. 19, 1968 N. P. FORMIGONI 3,411,200

FABRICATION OF SEMICONDUCTOR INTEGRATED CIRCUITS

Filed April 14, 1965

WITNESSES:

John L. Chopp

James F. Young

INVENTOR

Napoleon P. Formigoni

BY Gordon H. Telfer

ATTORNEY

United States Patent Office
3,411,200
Patented Nov. 19, 1968

3,411,200
FABRICATION OF SEMICONDUCTOR INTEGRATED CIRCUITS

Napoleon P. Formigoni, Baltimore, Md., assignor to Westinghouse Electric Corporation, Pittsburgh, Pa., a corporation of Pennsylvania Filed Apr. 14, 1965, Ser. No. 448,119
3 Claims. (Cl. 29—580)

ABSTRACT OF THE DISCLOSURE

In fabricating a semiconductor integrated circuit with a dielectric isolation medium, index grooves are formed in the surface of a body of semiconductor material to a depth desired for the thickness of the resulting device structures following which a support member is formed on the grooved surface and material is removed from the opposite surface uniformly down to the index grooves. Isolation grooves are then formed from the second surface and a second support member is formed on the exposed surface after which the first support member is removed.

This invention relates to fabrication of semiconductor structures and, more particularly, to the fabrication of semiconductor integrated circuits having dielectric isolation.

There have been prior proposals for the utilization of a dielectric medium, such as silicon dioxide, to isolate the electronic elements within a semiconductor integrated circuit and thus to provide substantial improvement over prior structures relying on reversed-biased P-N junctions for isolation. Reference should be made to copending application Ser. No. 410,666, filed Nov. 12, 1964, by Murphy et al., now abandoned and assigned to the present assignee for further information on the provision of dielectric isolation in integrated circuits.

A problem existing in the prior technique is that in the removal of single crystalline material to arrive at the final device surface there is insufficient control to insure adequately its proper location and to permit reproducible integrated circuit fabrication. Some proposals have been made to alleviate the problems involved through the use of preferential etchants and the use of a stopping layer, e.g. of silicon dioxide, to form a functional layer of controlled thickness having a high quality surface. Some success has been achieved in accordance with these previous techniques. It is still desirable to provide greater simplicity and reproducibility.

It is, therefore, an object of the present invention to provide an improved method to achieve dimensional control and surface quality in structures for integrated circuits having dielectric isolation.

Another object is to provide an improved method for fabricating semiconductor structures for integrated circuits that requires less critical operations than previously.

The invention achieves the above-mentioned and additional objects and advantages in a method that includes the formation of index grooves in a surface of a body of semiconductor material to a depth desired for the thickness of the resulting device structures, forming a suppart member on the grooved surface, removing the material from the opposite surface uniformly down to the index grooves and forming isolation grooves and a second support structure on the exposed surface after which the first support member is removed.

The index grooves are etched along the separation line between devices, and therefore do not affect either mechanically or electrically the function of the device.

The invention, together with the above-mentioned and additional objects and advantages thereof will be better understood by reference to the following description taken with the accompanying drawing wherein:

FIGS. 1 to 5 are partial sectional views at various stages in the fabrication of semiconductor integrated circuits in accordance with the present invention.

Figure 1:
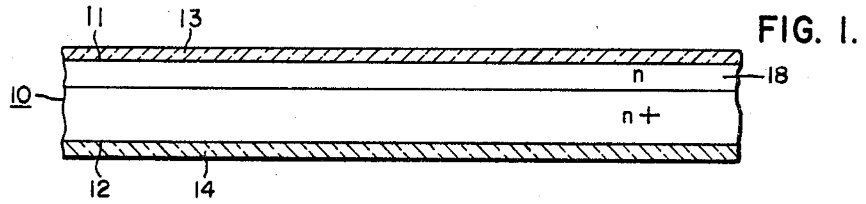

Referring to FIG. 1, a semiconductor body 10 of device quality material having opposed major surfaces 11 and 12 that are substantially planar is oxidized to form the insulating layers 13 and 14. The body may be of silicon and the insulating layer of silicon dioxide. In a preferred form of the invention, the starting material consists of an $n+$ substrate 16 on which there has been deposited a layer 18 of $n$ type material of controlled thickness and greater resistivity in accordance with the preferred method of forming transistors in semiconductor integrated circuits.

Figure 2:
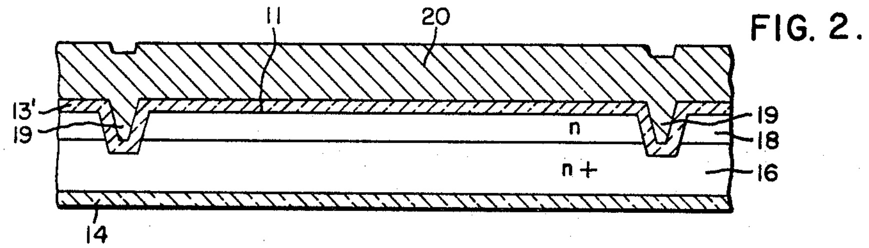

FIG. 2 shows the structure after index grooves have been formed in the surface of the $n$ type layer as by photoresist and etching techniques following which a layer 13' of pyrolytic oxide is deposited. A body 20 of semiconductor material is then grown that is coherent but need not be monocrystalline and will be generally referred to herein as a polycrystalline support member. This may be formed by the vapor reaction of silicon tetrachloride such as used in the formation of epitaxial layers.

Figure 3:
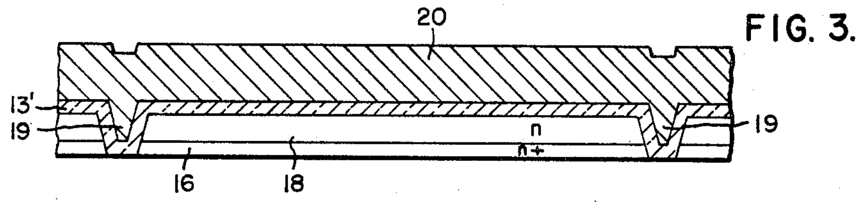

FIG. 3 shows the structure after the body of semiconductor material has been removed down to the insulating material 13' disposed within the index grooves 19. This removal may be performed by mechanical lapping and etching or both until it can be determined by the appearance of the oxide layer 13' that the proper position has been reached. It will be noted that the removal operation is not critical since the exposed surface of the $n+$ layer 16 is not for forming functional elements in the ultimate structure.

Figure 4:
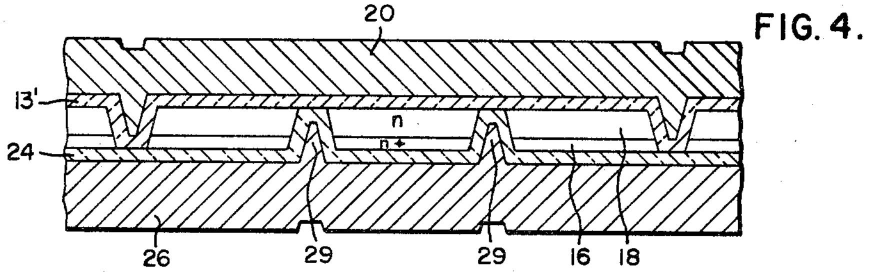
Figure 5:
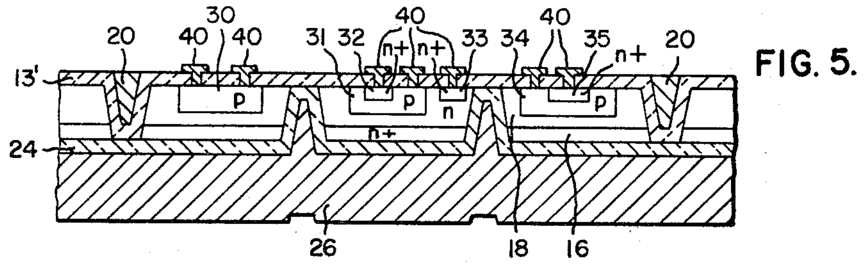

FIG. 4 shows the structure after isolation grooves 29 have been formed in the exposed surface of the $n+$ layer 16 in a pattern desired for the ultimate isolation of the electronic elements to be included within the integrated circuit. In this partial example three such portions are provided. The grooved surface is covered with a pyrolytic oxide layer 24 and a second support member 26 of polycrystalline material.

After the second support member 26 is formed the first support member 20 is removed as by etching or lapping down to the oxide layer 13', a noncritical operation. The structure is then processed in accordance with known techniques of selective diffusion to form electronic functional elements such as those illustrated in FIG. 5.

In the left-hand device portion a P type region 30 has been diffused having contacts 40 formed at its extermities to provide a resistor function. In the center portion a P type region 31 and $n+$ regions 32 and 33 have been diffused to form a transistor structure having contacts 40 to each of the regions. In the right-hand portion a P type region 34 and an $n+$ region 35 have been formed with contacts 40 to the diffused regions to form a diode or capacitor.

It is apparent that the fabrication of the individual electronic functional elements in the integrated circuit may be in accordance with any of the various known techniques previously practiced in structures having p-n junctions for isolation. The index grooves help provide uniform thickness for the functional layer and offer the additional advantage of providing an ideal guideline for the scribing and dicing of wafer into individual integrated circuits. That is, in fabricating a plurality of integrated circuits from a single wafer, the index grooves should surround each individual circuit. When the scribing is performed it is outside the material that provides the functional elements of the device and thus minimizes the chance of crystal damage. Also, the pockets of polycrystalline material remaining from the support member 20 on the upper edge of the integrated circuit provides some protection against strain encountered in the mounting and encapsulation of the structure.

It is to be understood that the individual techniques of epitaxial growth, oxide layer formation, groove etching and others employed in the practice of this invention may be performed in accordance with known technology partiticularly when silicon is the semiconductive material and silicon dioxide is the insulating material. Other semiconductive and insulating materials, may, however, also be used in the practice of this invention.

The invention thus provides an improved method of achieving dielectric isolation in integrated circuits while employing several individual techniques that have been used in prior proposals and are, therefore, readily practiced. For further information on some of these individual techniques, such as the use of an oxide layer (such as 13') as a stopping layer in the removal of material (support member 20) to achieve the final planar surface, reference should be made to copending application Ser. No. 448,120, filed Apr. 14, 1965 by L. J. Pollock and assigned to the present assignee.

While the present invention has been shown and described in a few forms only, it will be apparent that various changes and modifications may be made without departing from the spirit and scope thereof.

What is claimed is:

1. A method of fabricating a semiconductor structure suitable for an integrated circuit comprising: obtaining a body of semiconductor material having opposed major surfaces; forming a first set of grooves within said body from a first of said major surfaces; forming a layer of insulating material on said first major surface and within said grooves; depositing a quantity of coherent material over said first layer of insulating material to form a first support member; removing the material of said body from the second of said major surfaces to said first layer of insulating material within said first set of grooves; forming a second set of grooves within said body from said second surface to separate said body into a plurality of isolated device portions; forming a second layer of insulating material on said second major surface and within said second set of grooves; depositing a quantity of coherent material over said second layer of insulating material to form a second support member; and removing said first support member to permit fabrication of electronic elements in said plurality of isolated device portions.

2. In a method of fabricating integrated circuits, the steps comprising: obtaining a body of monocrystalline silicon having opposing major surfaces that are substantially planar and parallel; forming a first set of grooves within one of said major surfaces in a pattern outlining the individual integrated circuits to be fabricated from said body, said grooves extending from said surface within said body to a depth equal to that of the thickness of the functional portion of the integrated circuits to be fabricated from said body; forming a first layer of silicon dioxide over said surface and within said grooves; forming a first body of polycrystalline silicon on said first layer of silicon dioxide; removing material from the other of said major surfaces of said body of monocrystalline silicon to said first layer of silicon dioxide within said first set of grooves to form a new planar surface; forming a second set of grooves within said new planar surface in a pattern outlining the individual electronic elements to be fabricated and which are to be isolated from each other, said second set of grooves extending entirely through said body of monocrystalline silicon to said first layer of silicon dioxide on said one major surface; forming a second layer of silicon dioxide on said new planar surface and within said second set of grooves; forming a second body of polycrystalline silicon on said second layer of silicon dioxide; removing said first body of polycrystalline silicon down to said first layer of silicon dioxide.

3. In a method in accordance with claim 2, the further step of fabricating functional electronic elements in the portions of said body of monocrystalline silicon isolated by said second set of grooves and said second layer of silicon dioxide.

References Cited

UNITED STATES PATENTS

| | | | |
|---|---|---|---|
| 3,290,753 | 12/1966 | Chang | 29—25.3 |
| 3,300,832 | 1/1967 | Cave | 29—25.3 |

WILLIAM I. BROOKS, *Primary Examiner.*